United States Patent [19]

O'Keefe

[11] Patent Number: 5,939,739
[45] Date of Patent: Aug. 17, 1999

[54] SEPARATION OF THERMAL AND ELECTRICAL PATHS IN FLIP CHIP BALLASTED POWER HETEROJUNCTION BIPOLAR TRANSISTORS

[75] Inventor: Matthew Francis O'Keefe, Chelmsford, Mass.

[73] Assignee: The Whitaker Corporation, Wilmington, Del.

[21] Appl. No.: 08/866,478

[22] Filed: May 30, 1997

Related U.S. Application Data

[60] Provisional application No. 60/018,593, May 31, 1996.

[51] Int. Cl.[6] .......................... H01L 27/082; H01L 29/72; H01L 29/70
[52] U.S. Cl. .......................... 257/197; 257/580; 257/277; 257/579; 257/728
[58] Field of Search .................................. 257/197, 592, 257/578, 579–587, 198, 518, 588, 538, 552, 279, 728, 275, 276; 438/330, 304, 324

[56] References Cited

U.S. PATENT DOCUMENTS

| | | | |
|---|---|---|---|
| 3,414,969 | 12/1968 | Blum et al. | 29/577 |
| 3,918,080 | 11/1975 | Kerr | 357/36 |
| 4,689,655 | 8/1987 | Sonnenberger | 357/45 |
| 4,800,416 | 1/1989 | Musemeci | 257/580 |
| 5,161,000 | 11/1992 | Koga | 257/712 |
| 5,252,841 | 10/1993 | Wen et al. | 257/197 |
| 5,317,176 | 5/1994 | Schaper et al. | 257/578 |
| 5,321,279 | 6/1994 | Khatibzadeh et al. | 257/543 |
| 5,349,239 | 9/1994 | Sato | 257/737 |
| 5,371,405 | 12/1994 | Kagawa | 257/664 |
| 5,373,185 | 12/1994 | Sato | 257/587 |
| 5,374,844 | 12/1994 | Moyer | 257/582 |
| 5,378,922 | 1/1995 | Sovero | 257/582 |
| 5,408,124 | 4/1995 | Palara | 257/580 |
| 5,436,497 | 7/1995 | Miyauchi et al. | 257/587 |
| 5,444,292 | 8/1995 | Imhauser | 257/580 |
| 5,488,252 | 1/1996 | Johansson et al. | 257/579 |
| 5,519,233 | 5/1996 | Fukasawa | 257/275 |
| 5,532,506 | 7/1996 | Tserng | 257/276 |

(List continued on next page.)

FOREIGN PATENT DOCUMENTS

WO96/26548  8/1998  WIPO .......................... H01L 29/73

OTHER PUBLICATIONS

Patent Abstracts of Japan, Publication No. 05211279, Publication Date, Aug. 20, 1993, Application Date Nov. 20, 1991, Application No. 03303671.

Patent Abstracts of Japan, Publication No. 07221190, Publication Date, Aug. 18, 1995, Application Date Feb. 7, 1994, Application No. 06013870.

Richard Perko, "Glass Microwave IC Packaging Technology", May 10, 1994, pp. 857–862.

Ping Li, Timothy Boles, A New Technology for Si Microwave Power Transistor Manufacturing, Jun. 1996, pp. 103–106.

*Primary Examiner*—Alexander Oscar Williams
*Attorney, Agent, or Firm*—William Francos; June B Schuette

[57] ABSTRACT

The present invention relates to a heterojunction bipolar transistor structure having a device mesa 401 with a collector region 402, a base region 403 and an emitter region 404. An emitter metal layer 405 is connected to a ballast resistor 406 which in turn is connected to an emitter bump 407 by way of the air bridge 408. The thermal bump 409 is connected to the emitter metallization by way of a layer of heat dissipation material 410, preferably silicon nitride. The present structure enables dissipation of heat at the emitter contact as well as a ballast resistor connected to the emitter by way of metallization 405. This arrangement enables the dissipation of joule heat to avoid higher temperature of operation which results increased current at the collector which increases the temperature thereby further increasing the current, as well as provides a ballast resistor to reduce the collector current back to an acceptable value to avoid thermal runaway. The present invention effects the desired result without the creation of a natural resonator by separating the thermal and electrical paths.

5 Claims, 2 Drawing Sheets

U.S. PATENT DOCUMENTS

| | | | |
|---|---|---|---|
| 5,612,556 | 3/1997 | Malhi et al. | 257/257 |
| 5,616,950 | 4/1997 | Liu | 257/582 |
| 5,652,693 | 7/1997 | Chou et al. | 361/306.1 |
| 5,668,388 | 9/1997 | Delage et al. | 257/197 |
| 5,684,326 | 11/1997 | Johansson et al. | 257/582 |
| 5,696,466 | 12/1997 | Li | 330/286 |
| 5,760,457 | 6/1998 | Mitsui et al. | 257/582 |

SEPARATION OF THERMAL AND ELECTRICAL PATHS IN FLIP CHIP BALLASTED POWER HETEROJUNCTION BIPOLAR TRANSISTORS

This application claims the benefit of U.S. Provisional Application No. 60/018,593, filed May 31, 1996.

FIELD OF THE INVENTION

The present invention relates to a heterojunction BJT having safeguards against thermal runaway.

BACKGROUND OF THE INVENTION

The present invention relates to a technique and apparatus, therefore, for improving heterojunction bipolar transistor stability.

Bipolar semi-conductor devices are inherently thermally unstable, especially when biased with a low impedance bias circuit as is normally required for power amplifier applications. This is a self-feeding problem, wherein the higher temperatures of operation result in an increased current at the collector which in turn increases the temperature thereby further increasing the current. The relationship of pn junction diode current and temperature is well known, and clearly the increase in temperature results in an increase in current which in turn results in an increase in temperature. A solution to the problem of collector current run-away is to place a small but finite resistance in the emitter of the transistor. Then, as the collector current increases, the emitter voltage increases, decreasing the emitter-base voltage drop, thereby reducing the collector current back to an acceptable value. This type of negative feedback with a ballast resistor is well known in the field of bipolar junction transistors.

In most applications, the ballast resistor is optimally distributed over the emitter fingers so that the feedback can be more effectively utilized to control runaway current in an individual or small group of fingers. Often times, a thin film or implanted resistor is placed at the end of each emitter finger or pair of fingers. This technique is advantageous in that one can readily modify the resistance value by modifying the geometry of the resistor without changing the resistor process. An alternative technique is to grow or implant a lightly doped semi-conductor region above the device emitter to provide the ballasting resistance. This technique is less advantageous than the first mentioned technique because the emitter area is defined by the fabrication transistor process and often one can not change the resistor value without modifying the transistor growth and/or fabrication process. Additionally, it is often difficult to actually control the resistance of lightly doped semi-conductor materials. Accordingly, the off-finger resistance technique is often used.

While it is true that the placement of off-finger resistance will serve to reduce the current and thereby to a great extent reduce the ill-effects of joule heating, there is clearly heat generated through the operation of the device which may be detrimental to device performance. Accordingly, it is necessary to have means to dissipate the heat from the device, preferably at the emitter where the heat is generated. There are basically two methods to reduce the thermal impedance of the device. The first technique extracts the heat generated through the semi-conductor material. To optimize this structure, the material below the heat generating active area must generally be very thin on the order of microns. This low yield process hence not practical for production. An alternative method is to extract the heat generated from the top of the device through the contact metals and place these contact metals on a large heat sink. This is most readily achieved by turning the device upside-down on the heat sink. Accordingly, this process is well known in the art as flip-chip technology. In most cases, the interface between the device contacts in the heat sink is a relatively thick region of metal. This region of metal is deposited in many ways but is usually referred to as a "bump" hence flip-chip heat dissipation is often referred to as "bumping". To attach the bump to the heat sink, solders are often used and often therefore this process is known as solder bumping.

Flip-chip mounting of an HBT requires the mounting bump to be placed directly over the emitter fingers as this is where the heat is generated and therefore must be extracted. In conventional flip-chip mounting in GaAs devices, the bump would provide the path to thermal ground and the path also to the electrical ground, resulting in a low-thermal resistance device while maintaining a low ground inductance, which is important for high gain power devices. This configuration, however, does not allow one to place an off-finger ballast resistor between the emitter fingers and the ground because the ground bump must lie directly over the emitter fingers to maintain low-thermal resistance.

Turning to FIG. 1, one possible solution is shown for the extraction of heat through the heat sink as well as the necessary connection for the off-finger resistor. To this end, the mesa type structure HBT 101 having the emitter (102) base (103) and collector 104, is electrically connected to the resistor 105 off the emitter (102) by way of the metallization (106). A layer of silicon nitride or other suitable material (107) for heat dissipation is connected to the top of the metallization at the emitter as well as to the resistor (105). The metal layer (108) serves as the electrical and thermal path in this arrangement. FIG. 2 shows a top view of the schematic for the electrical contacts of the device shown in FIG. 1. This arrangement as shown in FIG. 1 runs the electrical path from the emitter fingers off to a resistor and then back through a bump which is electrically but not thermally isolated from the emitter fingers by way of the layer of heat sink material such as $Si_3N_4$. Unfortunately, this arrangement creates a natural inductor in through the metallization from the emitter to the resistor and then back to the bump and a natural capacitor between the emitter fingers and the metallization. This extra ground inductance causes many problems including a reduced gain, and instability problems such as when the inductance resonates with the dielectric spacer capacitance to create an unstability.

Turning to FIG. 3, an alternative arrangement is shown which reduces the ill-effects of the natural inductance. The structure as shown in FIG. 3 is not practical for the following reasons. The emitter structure 301 has a well defined area which is predetermined by the area of the mask. This area is well defined as the transistor characteristices, such as frequency and power are determined by the area of the emitter mesa as is well known to one of ordinary skill in the art. Accordingly, the electrical performance of the device which is dependent upon these characteristics is also well defined by the predesignation of the emitter mesa area. The resistor 302 is fabricated through an epitaxial growth of a suitable epitaxial material, having a well defined area again defined by the mask layer. Because the area of this epitaxial material is well defined, the resistance is well defined as well. Accordingly, effecting a change in the resistance is difficult, as there are basically two techniques in which this can be carried out. The first technique would be to change the area of the resistor 302 through a change in the mask layer.

However, changing the mask layer will also change the emitter mesa area and in the process would thereby change the device characteristics which are defined by the emitter mesa area as is described above. The alternative approach would be to change the epitaxial material used to change the resistance while maintaining the area constant. Unfortunately, this is also an unattractive option as a change in the epitaxial material would be prohibitively expensive. Accordingly, the device structure as shown in FIG. 3 is unattractive as it would require a significant alteration in the processing steps or a significant increase in the cost due to the differing epitaxial material used for the resistance.

Accordingly, what is needed is a device which will enable the dissipation of joule heat as well as provide the required ballast resistors without the creation of the resonator that results in the conventional technique described above. Furthermore, what is required is a technique for fabricating the HBT having the thermal dissipation characteristics as well as ballast resistors in off-finger sight which is within the standard techniques of fabrication of the HBT. Such a technique will offer both the required end product as well as the advantage of standard processing steps.

SUMMARY OF THE INVENTION

The present invention relates to a heterojunction bipolar transistor structure having two separate paths, one for dissipation of heat from the emitter fingers and one for connection to ballast resistors at the emitter fingers. To this end, the invention of the present disclosure overcomes the ill effects of joule heating by the use of the thermal dissipation path as well as by the use of ballast resistors selectively placed in the emitter contact path. The disclosure of the present invention enables the dissipation of heat and the avoidance of thermal runaway without the disadvantage of the conventional techniques described above by avoiding the creation of LC resonant circuit elements which are inherent in the conventional device described above. The solution to the problem described above is through the use of two separate bumps. The first bump provides a low ground inductance path that rests over the resistors and the second bump dissipates heat at the collector and is placed over the emitter fingers. This multipath structure provides both a low inductance ground path through the off-finger ballast resistors as well as a low resistance thermal path which lies directly above the emitter fingers. The invention of the present disclosure has the further advantage that the overall structure having the dual paths, one for connection to the ballast resistor and one for thermal dissipation is achieved using the same known processes utilized to fabricate the standard mesa transistor structure. That is to say, there is a great advantage gained in the fact that conventional techniques well known to one of ordinary skill in the art can be utilized as well as techniques familiar in the fabrication of the mesa structure having proven reliability and yield can be utilized.

The device of the present disclosure has a mesa structure heterojunction bipolar transistor having emitter metallization connected to a metalization which in turn is connected to a ballast resistor at an off-emitter site. The same emitter metalization has deposited thereon a layer of silicon nitride which serves as a heat sink, or thermal path. Thereafter, a metal layer or bump is deposited on the silicon nitride layer. Additionally, the ballast resistor has a metal bump connected thereto for further electrical connection to a ground.

OBJECTS, FEATURES, AND ADVANTAGES

It is an object of the present invention to have a structure of a heterojunction bipolar transistor that avoids the ill effects of thermal runaway by the selective placement of a heat sink and a ballast resistor.

It is a feature of the present invention to have a heat sink which is connected to the common mode contact and to a first bump, and a ballast resistor which is connected to the emitter contact and to a second bump.

It is an advantage of the present invention to have a HBT which overcomes the ill effects of thermal runaway while avoiding instability created by inherent resonator circuits.

It is a further advantage of the present invention to have a HBT which is not subject to the ill-effects of thermal runaway fabricated using processing steps which do not diverge greatly from the steps used to fabricate a conventional HBT.

DETAILED DESCRIPTION OF THE PREFERRED EMBODIMENT

Figure 1:
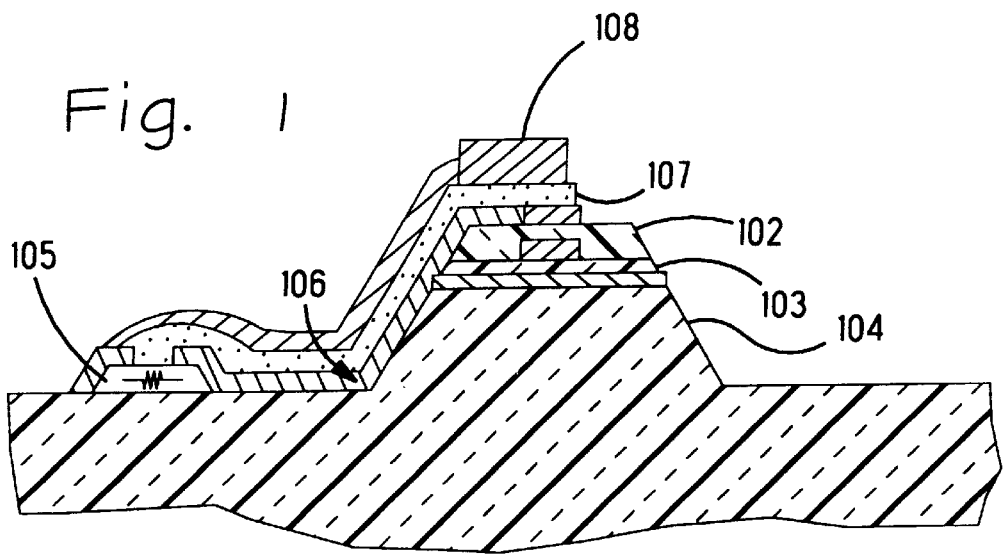
FIG. 1 is a cross sectional view of a HBT having a ballast resistor, a heat sink and a common electrical path therefore.
Figure 2:
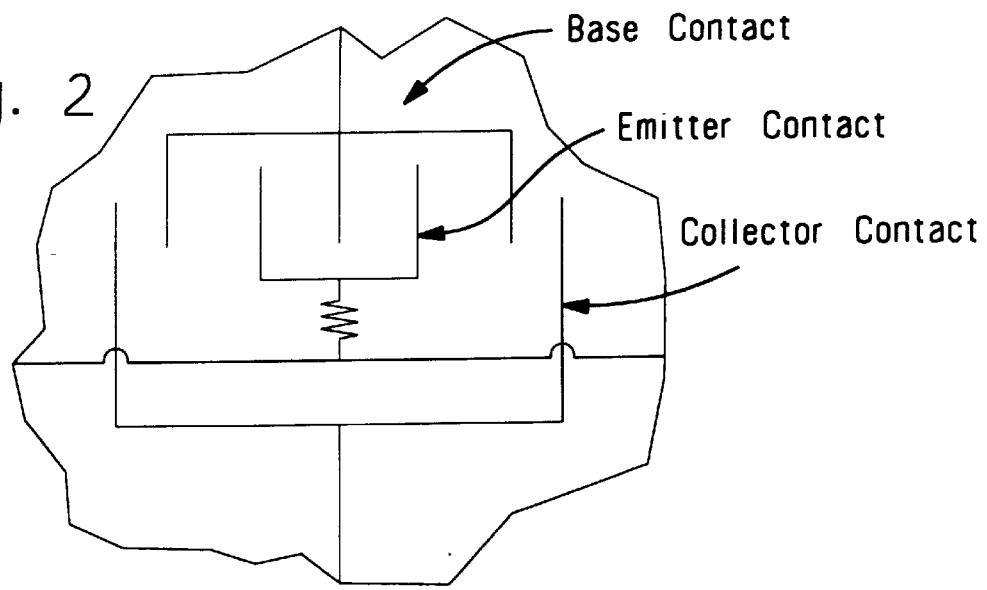
FIG. 2 shows the inter digitation of metalization for the heterostructure bipolar transistor.
Figure 3:
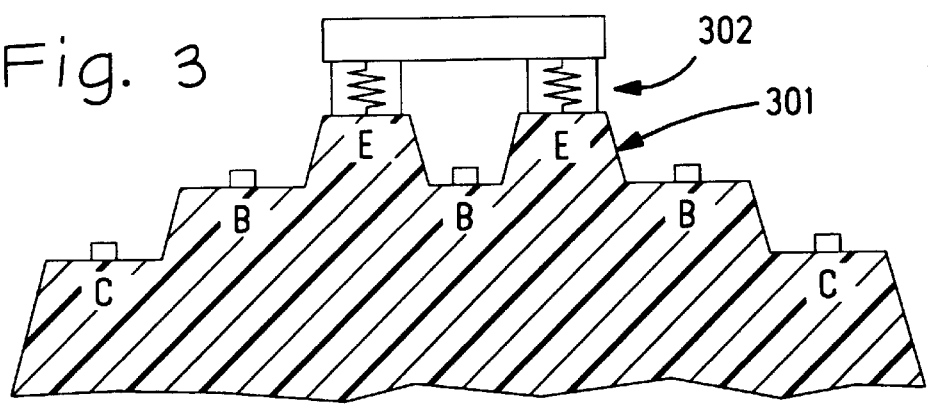
FIG. 3 shows a cross sectional view of an air bridge heat dissipation technique having the emitter ballast resistor defined therein.
Figure 4:
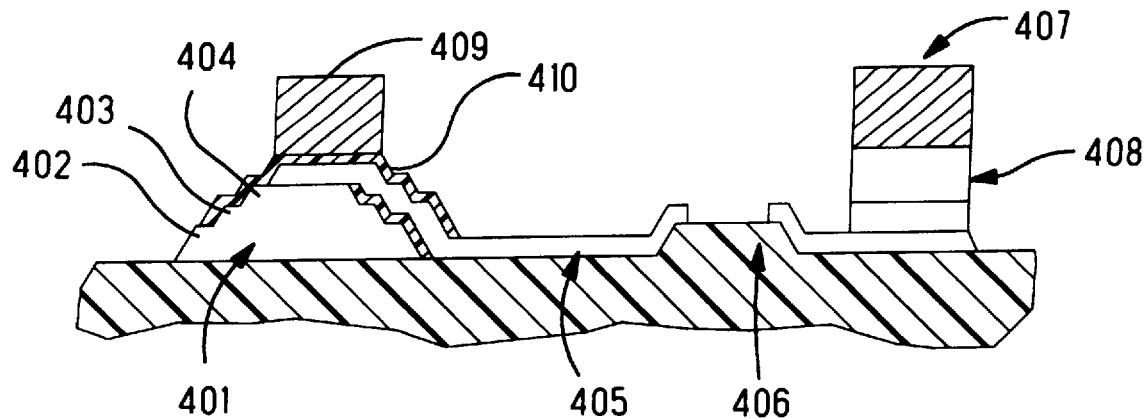
FIG. 4 is a cross sectional view of the device of the present invention having a first bump for heat extrusion and a second bump connected to the metallization of the ballast resistor.
Figure 5:
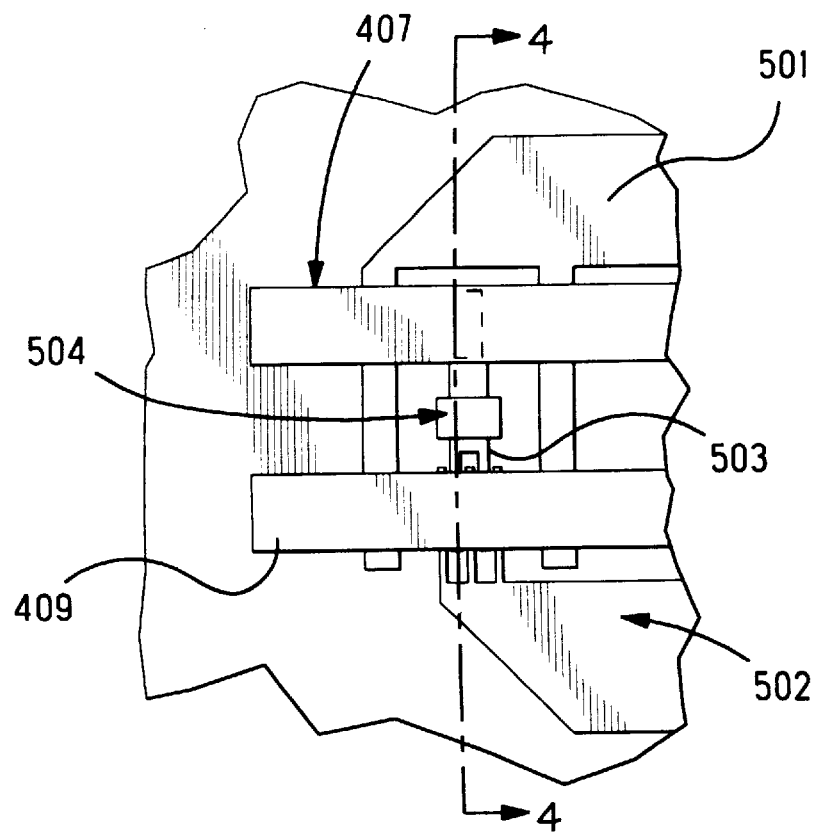
FIG. 5 shows the inner-digitation of metallization of the device shown in FIG. 4.

Turning to FIG. 4, a cross-sectional view of the device of the present invention is shown. To this end, the device mesa 401 is shown having the collector region 402 the base region 403 the emitter region 404, is shown. The emitter metal layer is shown at 405 being connected to the ballast resistor 406 which is in turn connected to the emitter bump 407 by way of the air bridge 408. The thermal bump 409 is connected to the emitter metallization by way of a layer of heat dissipation material 410 preferably silicon nitride ($Si_3N_4$), which is disposed on top of a portion of the emitter metal layer 405, as shown in FIG. 4. FIG. 5 shows a top view of the device shown in cross section in FIG. 4. The collector contact metal 501 has interdigitation with the base contact metal 502 and the emitter contact metal 503. The ballast resistor 504 is connected to the emitter contact as well as to the metallization which is thereafter connected to the emitter bump as shown at 407.

The structure of the present invention is fabricated as follows. A substrate of semiconductor thereupon epitaxial layers are deposited is selectively etched to form the mesa structure and facilitate access to the individual epitaxial layers. Thereafter, the required steps for fabrication of the metallization to effect the electrical contacts, is carried out as follows. Advantageously, the resistor is fabricated through definition of the device mesa. Electrical isolation is achieved by depositing a thermally conductive yet electrically insulating material, for example $Si_3N_4$. Deposition of the electrical and thermal bumps is effected by deposition techniques such as electron beam evaporation and/or electroplating.

In operation, as heat is generated through the operation of the device, the DC collector current will increase with the increase in temperature through the effects of joule heating.

As the collector current increases, the emitter voltage increases, decreasing the base-emitter voltage drop. This in turn reduces the collector current back to a nominal value. As can be seen, the emitter metal 405 makes the electrical connection to the ballast resistor 406 which is thereafter connected to the emitter bump 407 by way of the emitter air bridge 408. Additionally, the layer of insulator, preferably silicon nitride 410, dissipates heat by way of the thermal bump 409 as shown in FIG. 4. Accordingly, the device as shown in cross section in FIG. 4 enables the stable operation of the heterojunction bipolar transistor at relatively high power without the attendant disadvantages of thermal runaway by the use of the ballast resistor and thermal bump. Additionally, the structure of the present invention by having a separate thermal bump and emitter bump enables a device having a low ground inductance that rests as well as the low resistance thermal path which lies directly above the emitter fingers. As stated above, there is an appreciable advantage in the fact that the device shown in FIGS. 4 and 5 can be fabricated using basically the same processes used to fabricate the HBT conventionally. Finally, it is of interest to note that if required, the thermal bump 409 and the emitter bump 407 could be connected to a common point, for example a common ground.

The invention having been described in detail, it is clear that there are modifications of both the steps of manufacture as well as the disclosed structure and material that would be obvious modifications to one of ordinary skill in the art. To the extent that such modifications are within the theme and spirit of the teaching of the present invention, such modifications are deemed to be within the purview of the present invention. To this end, the present invention embodies a separate path structure for the thermal dissipation of heat and the connection to and from a ballast resistor of a bipolar junction transistor. To the extent that such modifications of the disclosure are within the purview of the present invention, such modifications are deemed within the scope of the present invention.

We claim:

1. A heterojunction bipolar junction transistor, comprising:

A device mesa having a collector region, a base region and an emitter region, said emitter region being electrically connected to a ballast resistor by way of an emitter metal layer; a layer of thermally conductive material disposed on top of a portion of said emitter metal layer, said thermally conductive material being electrically insulating, said thermally conductive material having a thermal bump disposed thereon; and an electrical bump connected to said resistor.

2. A heterojunction bipolar junction transistor as recited in claim 1, wherein said thermally conductive material is silicon nitride.

3. A heterojunction bipolar junction transistor as recited in claim 1, wherein said resistor and said electrical bump are connected by an airbridge metalization.

4. A heterojunction bipolar junction transistor (HBT), comprising:

A mesa having a collector region, a base region and an emitter region, said emitter region having an emitter metal layer connected thereto, and said metal layer being connected to an off-emitter ballast resistor; a thermally conductive layer disposed on a portion of said emitter metal layer, said thermally conductive layer being electrically insulating and said thermally conductive layer having a thermal bump disposed thereon; and an emitter bump connected electrically to said ballast resistor.

5. An HBT as recited in claim 4, wherein said thermally conductive layer is silicon nitride.

* * * * *